United States Patent
Chu et al.

[11] Patent Number: 5,888,842
[45] Date of Patent: Mar. 30, 1999

[54] METHOD OF MANUFACTURING POLARIZATION-CONTROLLED SURFACE EMITTING LASER ARRAY

[75] Inventors: Hye Yong Chu; Byueng-Su Yoo; Hyo-Hoon Park, all of Daejon, Rep. of Korea

[73] Assignee: Electronics and Telecommunications Research Institute, Daejon, Rep. of Korea

[21] Appl. No.: 919,620

[22] Filed: Aug. 28, 1997

[30] Foreign Application Priority Data

Aug. 28, 1996 [KR] Rep. of Korea ...................... 96-35935

[51] Int. Cl.⁶ ..................................... H01L 21/20
[52] U.S. Cl. .................................. 438/40; 438/45; 372/45
[58] Field of Search ................................ 438/40, 45, 978; 372/45, 96

[56] References Cited

U.S. PATENT DOCUMENTS 5,712,188   1/1998   Chu et al. .................................. 438/40

OTHER PUBLICATIONS

Toshikazu Mukaihara, et al., "Polarization Control of Vertical–Cavity Surface–Emitting Lasers Using a Birefringent Metal/Dielectric Polarizer Loaded on Top distributed Bragg reflector", IEEE Journal of Selected Topics in quantum Electronics, vol. 1, No. 2, Jun. 1995, pp. 667–673.

*Primary Examiner*—Charles Bowers
*Assistant Examiner*—Keith Christianson
*Attorney, Agent, or Firm*—Jacobson, Price, Holman & Stern, PLLC

[57] ABSTRACT

A method for manufacturing a surface-emitting laser array device is disclosed. In order to control the polarization characteristics of the surface-emitting laser, the surface-emitting laser array device according to the present invention can be manufactured by alternately arranging the surface-emitting laser formed by inclining a cavity in the <110> and <1$\overline{1}$0> direction in accordance with the row or the column direction of the surface-emitting laser, so that the polarization characteristics of the surface-emitting laser in two directions which are relatively perpendicular to each other may be obtained. According to the present invention, it has an advantageous effect that the interaction between the adjacent laser beams can be minimized with maintaining the symmetric feature of the lasing beam when manufacturing an integrated surface-emitting laser array device. Further, since the traveling direction of the lasing beam can be controlled depending upon the polarization characteristics, not only the optical interconnection or optical switching can easily be performed, but also the device can effectively be applied to the device, for example, the magneto-optic disk which is sensitive to the polarization characteristics.

2 Claims, 6 Drawing Sheets

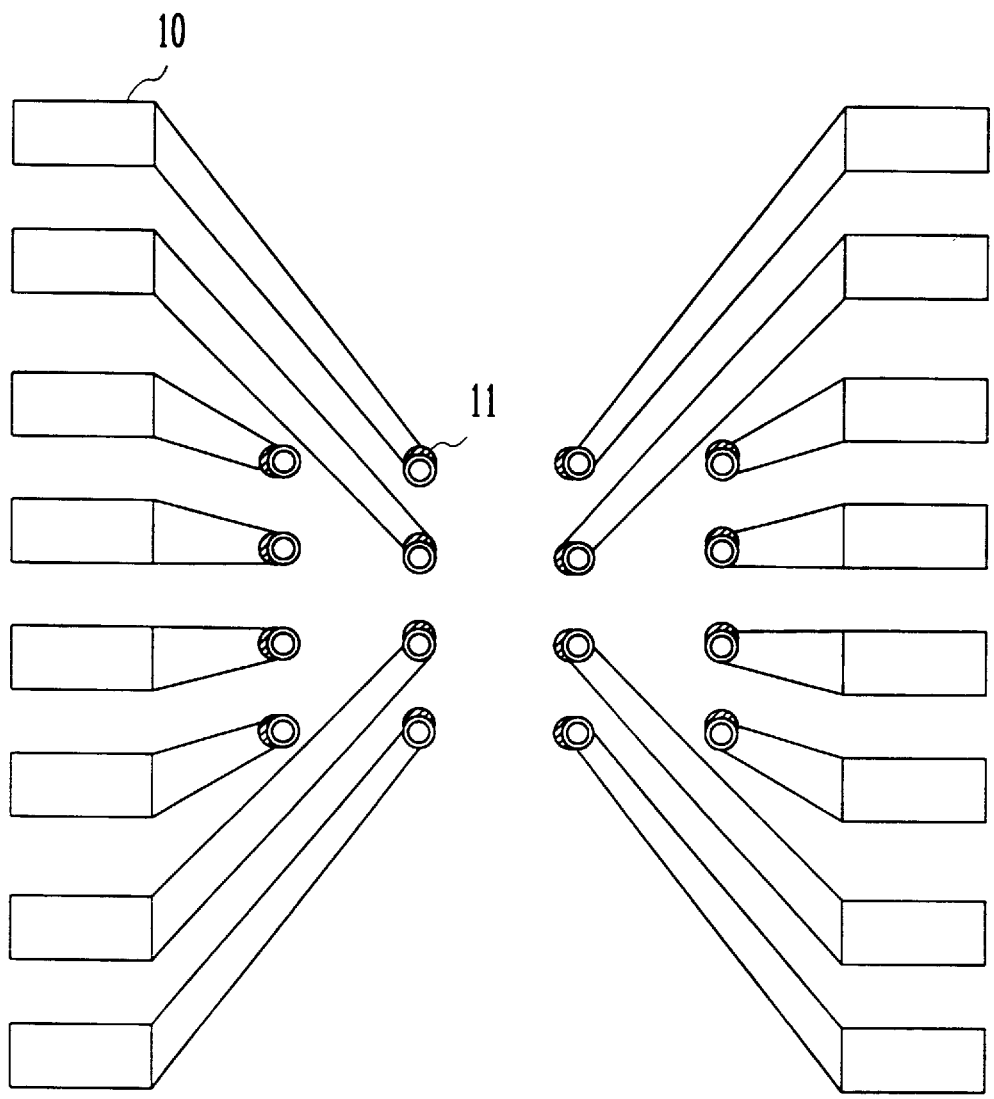

METHOD OF MANUFACTURING POLARIZATION-CONTROLLED SURFACE EMITTING LASER ARRAY

BACKGROUND OF THE INVENTION

1. Field of the Invention

The present invention relates to a method for manufacturing a surface emitting laser array, and more particularly, to a method for manufacturing the same in which polarization characteristics which constitute a laser array are controlled by alternately arranging the surface emitting laser formed by sloping a cavity in the <110> or <1$\bar{1}$0> direction and etching the same in accordance with the row or the column direction of the surface emitting laser.

2. Description of the Related Art

In general, a vertical-cavity surface-emitting laser has characteristic which the polarization is randomly presented as opposed to a edge-emitting laser. Therefore, if such polarization characteristics are controlled in a desired direction, not only the optical connecting efficiency for optical interconnection or optical switching can be improved, but also it is greatly effective when it is applied to a device, such as a magneto-optics disk which is sensitive to the polarization.

As an example of the conventional method for controlling the polarization, the two methods that one is to etch the cavity into an asymmetric-type section, the other is to form a fine pattern on the surface thereof have been reported. However, there are disadvantages that the former loses the circularity of the laser beam and the latter makes the manufacturing process complicated since a technique which requires the high degree of difficulty, such as an electron-beam lithography method. First of all, the highest problem is that even though the both two methods may derive the polarization in one direction, but it cannot apply the deflection characteristics of the two directions which are relatively perpendicular to each other to a single semiconductor chip when in manufacture.

It is therefore an object of the present invention to provide a method for manufacturing a surface-emitting laser array in which polarization characteristics of the a surface-emitting laser are controlled by alternately arranging the surface-emitting laser formed by sloping and etching a cavity in the <110> and <1$\bar{1}$0> direction in accordance with the row or the column direction of the surface-emitting laser.

According to the present invention, since the surface-emitting laser array which has the polarization characteristics of the relatively perpendicular directions to each other and is manufactured by integrating it to a single semiconductor chip has a different polarization characteristics as compared to that the adjacent laser beams, the interaction therebetween can be minimized and the device may easily be applied to the device which is sensitive to the polarization characteristic. Further, the optical interconnection or optical switching can easily be performed.

SUMMARY OF THE INVENTION

For the purpose of summarizing the present invention, the method for manufacturing a surface-emitting laser array of the bottom-emitting type according to the first embodiment of the present invention is provided which comprises the steps of forming a bottom mirror layer, an active layer and a top mirror layer on the semiconductor substrate. An antireflection layer is then deposited on the rear surface of the semiconductor substrate. The edge portion of the antireflection layer is etched to form an N-type electrode at the edge portion thereof. A first photoresist is deposited on the top mirror layer to form a first mask pattern. The top mirror layer and the active layer to form the inclined sidewall with a face of the substrate being tilted about either one of a <110> or a <1$\bar{1}$0> direction and forming an angle ranging between 5° and 45° measured between the inclined sidewall and the <001> direction using the first mask pattern. The remaining first photoresistive layer formed on the top mirror layer as the first mask pattern is removed. A second photoresist layer on the entire surface of the resulting structure is then formed to form a second mask pattern. The top mirror layer and the active layer are etched with the slope degree of 5 to 45 in either one of the <110> or <1$\bar{1}$0> direction in accordance with the second mask pattern. The remaining second photoresist layer formed on the top mirror layer as the second mask pattern is removed. A planarization layer is formed on the entire surface of the resulting structure. The planarization layer planarizes the entire surface of the resulting structure where only the top surface of the surface-emitting laser array is exposed. A metal for p-type electrode is finally formed at predetermined portions of the top surface of the resulting structure, such that the surface-emitting laser array is completed.

In accordance with the second embodiment of the present invention, the method for manufacturing a surface-emitting laser array of top-emitting type comprises the steps of forming a bottom mirror layer, an active layer and an top mirror layer on the semiconductor substrate. A n-type electrode is formed at the rear surface of the semiconductor substrate. Deposited is a first photoresist layer on the top mirror layer to form a first mask pattern. The top mirror layer and the active layer to form the inclined sidewall with a face of the substrate being tilted either one of a <110> or a <1$\bar{1}$0> direction and forming an angle ranging between 5° and 45° measured between the inclined sidewall and the <001> direction using the first mask pattern. The remaining first photoresistive layer formed on the top mirror layer as the first mask pattern is removed. A second photoresist layer is then deposited on the entire surface of the resulting structure to form a second mask pattern.

The top mirror layer and the active layer are etched with the slope degree of 5 to 45 in either one of the <110> or <1$\bar{1}$0> direction in accordance with the second mask pattern. The remaining second photoresist layer formed on the top mirror layer as the second mask pattern is removed. A planarization layer is formed on the entire surface of the resulting structure. The planarization layer is planarized the entire surface of the resulting structure where only the top surface of the surface-emitting laser array is exposed. A p-type electrode ring shape pattern is finally formed at an edge portion of the top surface of the resulting structure, whereby the surface-emitting laser array of the top-emitting type is completed.

BRIEF DESCRIPTION OF THE DRAWINGS

The present invention will be more apparent upon a detailed description of the preferred embodiments for carrying out the invention as rendered below:

FIG. 3B illustrates a plan view of the 4×4 top surface emitting laser array device according to the present invention.

Similar reference charters refer to similar parts throughout the several views of the drawings.

DETAILED DESCRIPTION OF THE INVENTION

The operational principle of the surface-emitting laser array which the polarization characteristic is controlled according to the present invention will now be described hereinafter.

When the cavity is etched by sloping it, the gain and the loss of the polarization in the inclined direction of sidewall and the direction perpendicular to the inclined direction are different from each other. That is, the gain of the polarization in the direction perpendicular to the sloped direction is relatively high and the loss thereof is small, such that the laser beam with the polarization in this direction is mainly emitted. Thus, if the cavity is sloped in the <110> direction, the polarization characteristic in the <1$\bar{1}$0> direction is obtained. In contrast to the above, if the cavity is sloped in the <1$\bar{1}$0> direction, the polarization characteristics in the <110> direction is obtained. Accordingly, the surface-emitting laser with the desired polarization characteristic can be manufactured according to the inclined direction of sidewall. Using the principle as mentioned above, the surface-emitting laser array which has both the polarization characteristics in the two directions can be manufactured by alternately arranging the surface-emitting laser sloped in the <110> or <1$\bar{1}$0> direction in accordance with the row or the column direction of the surface-emitting laser.

Now, the polarization controlled surface-emitting laser array can be manufactured into two types of the top-emitting type and the bottom-emitting type and will be described more in detail with reference to FIGS. 1 to 3.

Figure 1A:
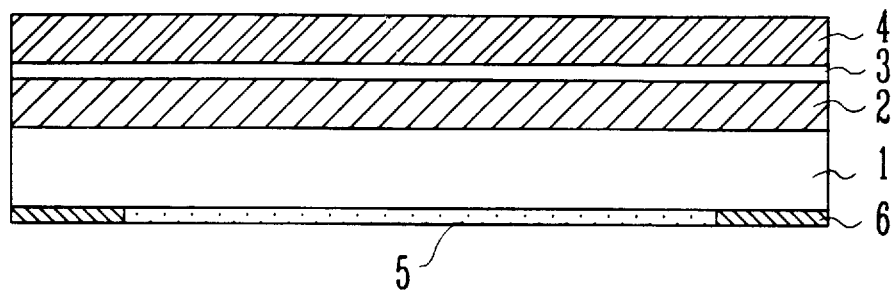
FIGS. 1A and 1E are sectional views sequentially representing the steps of manufacturing a 4×4 bottom-emitting type surface-emitting laser array according to the present invention.
Figure 1B:
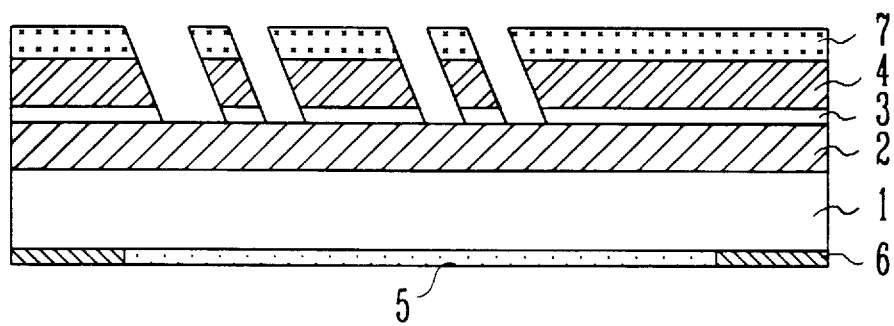
Figure 1C:
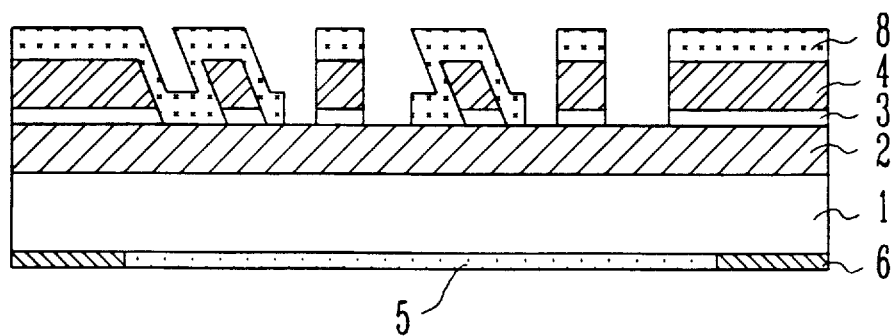
Figure 1D:
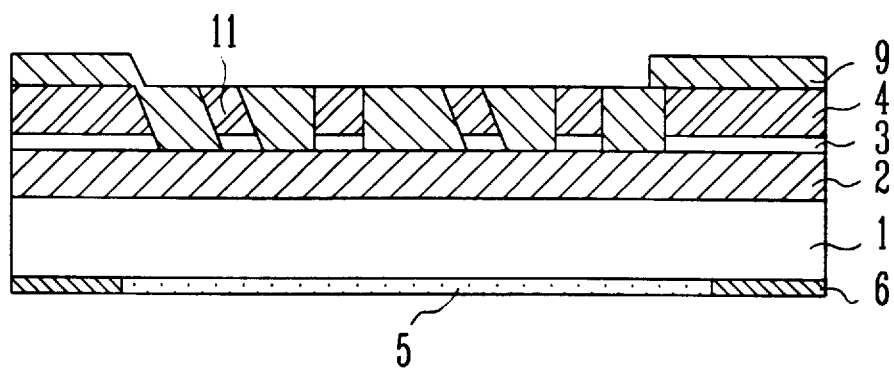
Figure 1E:
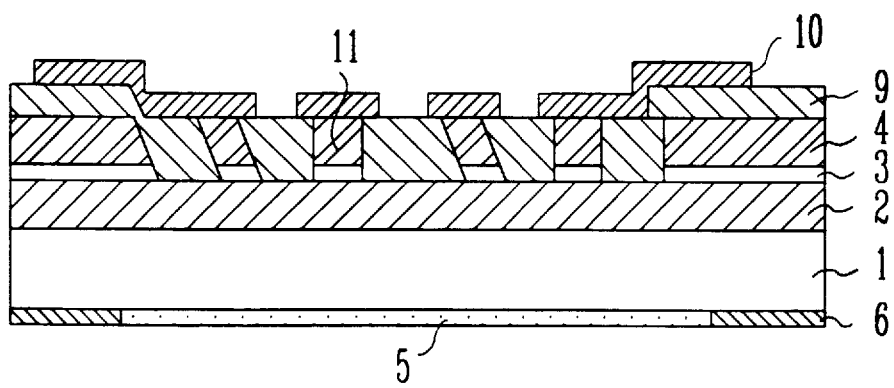

Turning first to FIGS. 1A and 1E, there are sectional views sequentially representing the steps of manufacturing an index-guided 4×4 bottom-emitting type surface-emitting laser array according to the present invention.

In FIG. 1A, a substrate of a vertical-cavity surface emission laser array device used in the manufacture is so constructed that a bottom mirror layer 2, an active layer 3, an top mirror layer 4 are sequentially formed on the semiconductor substrate 1. A SiOx/TiOx multi-layer as an antireflection layer 5 which satisfies an antireflection condition is formed on the rear surface of the semiconductor substrate 1. An edge portion of the antireflection layer 5 is etched and n-type electrode 6 is then formed at the edge portion so etched, as shown in the drawing.

In FIG. 1B, it represents that a first photoresist layer 7 is deposited on the top mirror layer 4 to form a first mask pattern. The substrate is inclined in the <110> or <1$\bar{1}$0> direction with the angle of degree of 5 to 45 about <001> direction and predetermined portions of the active layer 3 and top mirror layer 4 are then etched in accordance with the first mask pattern, using a Reactive Ion Etching (Hereinafter, referred to as "RIE") method or a Reactive Ion Beam Etching (Hereinafter, referred to as "RIBE") method.

FIG. 1C shows that the remaining first photoresist layer 7 is removed and a second photoresistive layer 8 is further deposited on the entire surface of the resulting structure to form a second mask pattern. The substrate is then inclined in the direction perpendicular to the forementioned direction in FIG. 1B, that is, in the <110> or <1$\bar{1}$0> direction with the angle of degree of 5 to 45 about <001> direction and the active layer 3 and top mirror layer 4 are again etched in accordance with the second mask pattern, using the RIE method or the RIBE method.

In FIG. 1D, it illustrates that the remaining second photoresistive layer 8 is removed and a planarization layer 9 is deposited on the entire surface of the resulting structure. The planarization layer 9 planarize the entire surface of the resulting structure with only the top surface of the surface-emitting laser array being exposed. A p-type electrode 10 is formed at a predetermined portion around the cavity 11 whereby the resulting surface-emitting laser array device shown in FIG. 1E is completed.

Figure 2A:
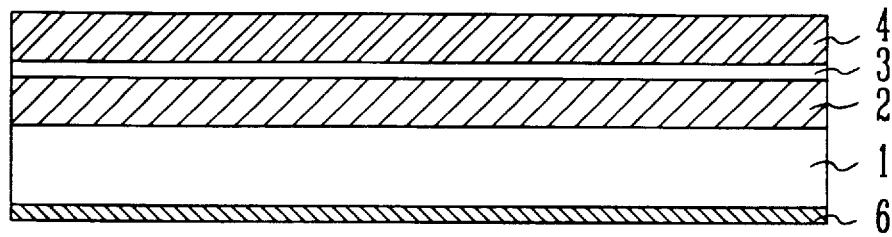
FIGS. 2A and 2E are sectional views sequentially representing the steps of manufacturing a 4×4 top-emitting type surface-emitting laser array according to the present invention.
Figure 2B:
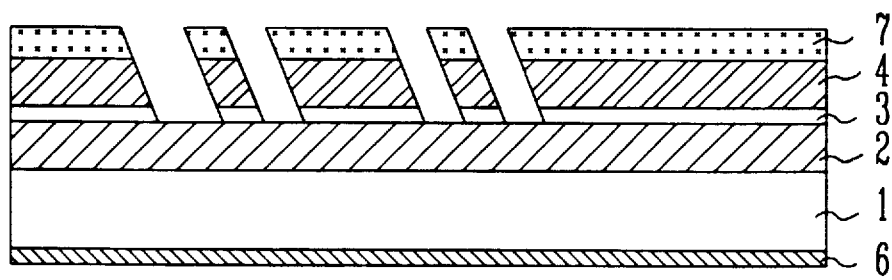
Figure 2C:
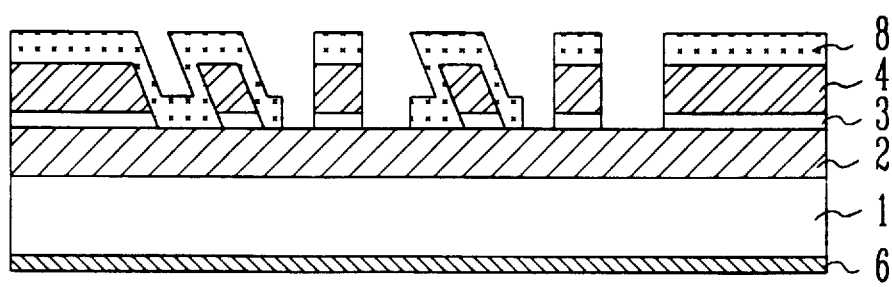
Figure 2D:
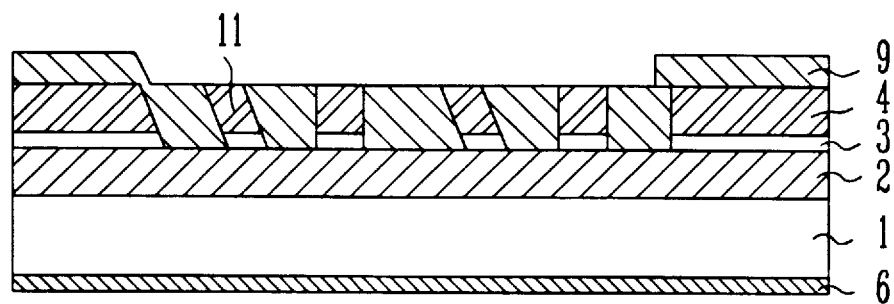
Figure 2E:
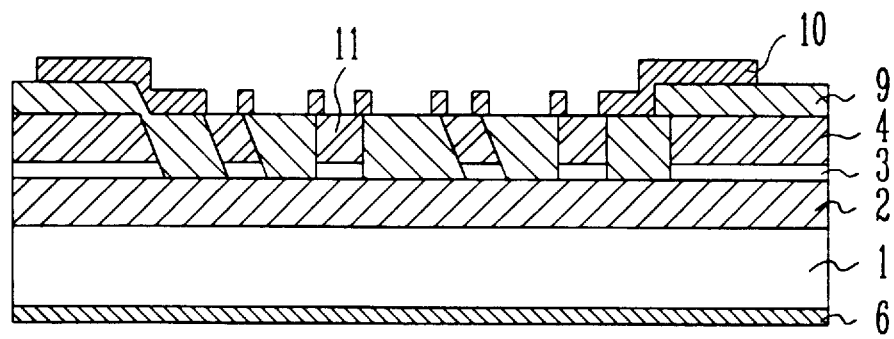

FIGS. 2A and 2E are sectional views sequentially representing the steps of manufacturing an index-guided 4×4 top-emitting type surface-emitting laser array device according to the present invention.

Referring first to FIG. 2A, a substrate of a vertical-cavity surface-emitting laser array used in the manufacture is so constructed that a bottom mirror layer 2, an active layer 3, an top mirror layer 4 are sequentially formed on the semiconductor substrate 1. A n-electrode 6 is then formed at the rear surface of the semiconductor substrate 1, as shown in the drawing.

FIG. 2B represents that a first photoresist layer 7 is deposited on the top mirror layer 4 to form a first mask pattern. The substrate is inclined in the <110> or <1$\bar{1}$0> direction with the angle of degree of 5 to 45 about <001> direction and the active layer 3 and top mirror layer 4 are etched in accordance with the first mask pattern, using the RIE method or the RIBE method.

FIG. 2C shows that the remaining first photoresist layer 7 is removed and a second photoresist layer 8 is formed a second mask pattern. The substrate is then inclined in the direction perpendicular to the forementioned direction in FIG. 1B, that is, in the <110> or <1$\bar{1}$0> direction with the angle of degree of 5 to 45 about <001> direction and the active layer 3 and top mirror layer 4 are etched in accordance with the second mask pattern, using the RIE method or the RIBE method.

In FIG. 2D, it illustrates that the remaining second photoresist layer 8 is removed and a planarization layer 9 is formed on the entire surface. The planarization layer 9 is planarized the entire surface of the resulting structure with only the top surface of the surface-emitting laser array being exposed. A ring shape metal pattern a p-type electrode 10 is formed at the edge portion of the surface of the surface-emitting laser array such that the laser beam is emitted onto the surface. That is, it is constructed such that the p-type electrode pad 10 is formed only at the edge portion of the cavity 11, as shown in FIG. 2E.

Figure 3A:
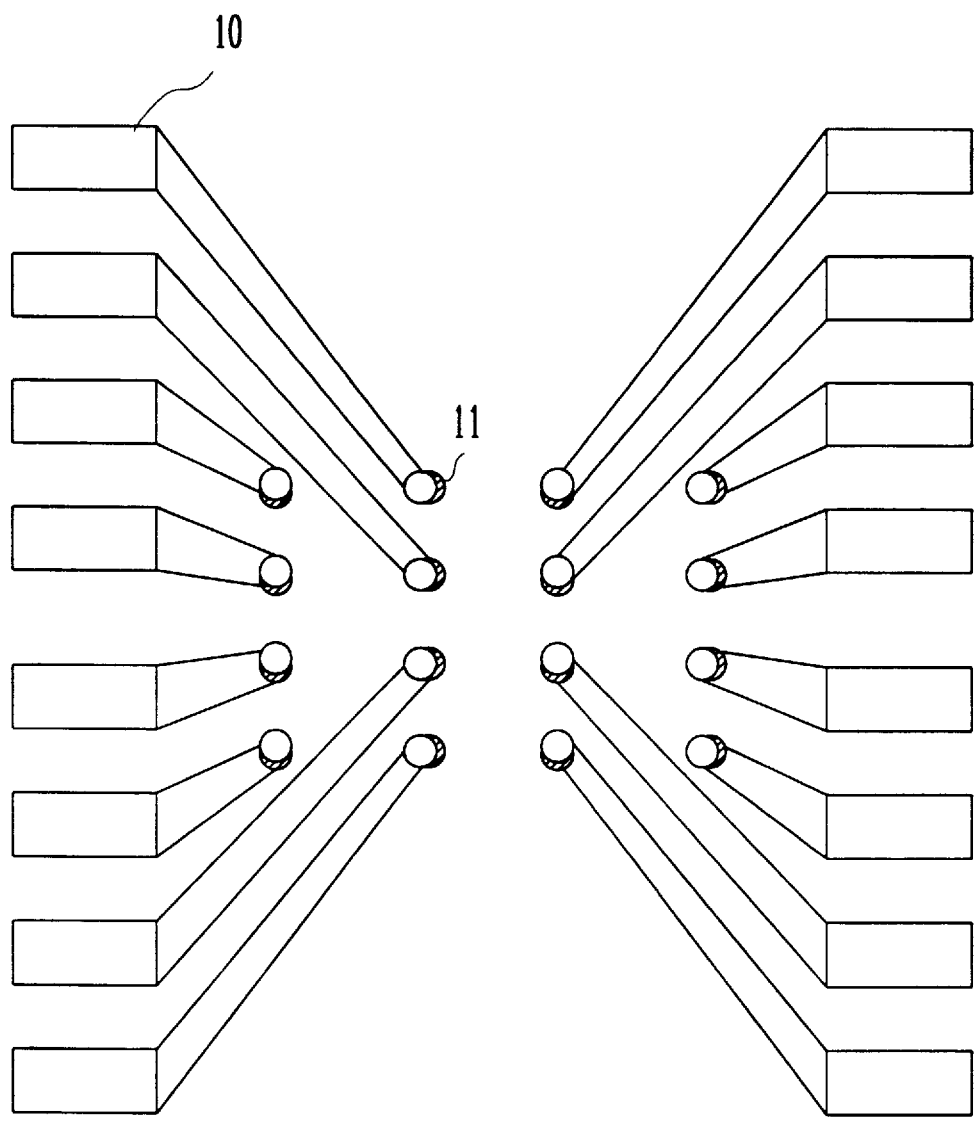
FIG. 3A represents a plan view of the 4×4 bottom-emitting type surface-emitting laser array according to the present invention.

FIG. 3A represents a plan view of an index-guided 4×4 bottom-emitting type surface-emitting laser array according to the present invention. In the drawing, a the cavities 11 of the polarization controlled 4×4 surface-emitting laser array are shown that they are formed to be sloped both downward and leftward in the row direction, alternately. Circles positioned at the center area represent the cavities 11 and its top portions thereof are clogged.

In FIG. 3B, it illustrates a plan view of a polarization controlled 4×4 top-emitting type surface-emitting laser array according to the present invention, in which the cavities 11 of the polarization controlled 4×4 surface-emitting laser array are shown that they are formed to be sloped both leftward and upward in the row direction, alternately. Small circles positioned at the center area represent the cavities 11 and their top portions thereof are open.

As fully described above, according to the present invention, it has superior advantages that the interaction between the adjacent laser beams can be minimized in manufacturing an integrated surface-emitting laser array. Further, since the lasers with perpendicular polarization direction can be arranged to the purpose, not only the optical interconnection or optical switching can easily be performed, but also the device can effectively be applied to the device, such as, the magneto-optic disk which is sensitive to the polarization characteristics.

The present invention has been described with reference to a particular embodiments in connection with a particular applications.

What is claimed is:

1. A method for manufacturing a surface emitting laser array device, comprising the steps of:

forming a bottom mirror layer, an active layer, and a top mirror layer on a semiconductor substrate;

depositing an antireflection layer having an edge portion on the rear surface of the semiconductor substrate;

etching the edge portion of the antireflection layer to form an n-type electrode at the edge portion thereof;

depositing a first photoresist on the top mirror layer to form a first mask pattern;

first etching predetermined portions of the top mirror layer and the active layer with the slope degrees of 5 to 45 in either one of the <110> or <1$\bar{1}$0> direction in accordance with the first mask pattern;

removing the remaining first photoresist layer formed on the entire top mirror layer as the first mask pattern;

forming a second photoresist layer on the entire surface of the resulting structure to form a second mask pattern;

second etching predetermined portions of the top mirror layer and the active layer with the slope degrees of 5 to 45 in either one of the <1$\bar{1}$0> or <110> direction which is perpendicular to the direction of the step of first etching in accordance with the second mask pattern;

removing the remaining second photoresist layer formed on the top mirror layer as the second mask pattern;

forming a planarization layer on the entire surface of the resulting structure;

planarizing the polyamide planarization layer in order to make the entire surface of the resulting structure with only the top surface of the surface-emitting laser array being exposed; and forming a metal for p-type electrode at predetermined portions of the top surface of the resulting structure, whereby the surface-emitting laser array is completed.

2. A method for manufacturing a surface emitting laser array device, comprising the steps of:

forming a bottom mirror layer, an active layer and a top mirror layer on a semiconductor substrate;

forming an n-type electrode at the rear surface of the semiconductor substrate;

depositing a first photoresist layer on the entire top mirror layer to form a first mask pattern;

first etching the top mirror layer and the active layer with the slope degrees of 5 to 45 in either one of the <110> or <1$\bar{1}$0> direction in accordance with the first mask pattern;

removing the remaining first photoresist layer formed on the top mirror layer as the first mask pattern;

depositing a second photoresist layer on the entire surface of the resulting structure to form a second mask pattern;

second etching the top mirror layer and the active layer with the slope degrees of 5 to 45 in either one of the <1$\bar{1}$0> or <110> direction which is perpendicular to the direction of the step of first etching in accordance with the second mask pattern;

removing the remaining second photoresist layer formed on the top mirror layer as the second mask pattern;

forming a planarization layer on the entire surface of the resulting structure;

planarizing the planarization layer the entire surface of the resulting structure with only the top surface of the surface-emitting laser array being exposed; and forming a p-type electrode ring shape pattern at an edge portion of the top surface of the resulting structure, whereby the surface-emitting laser array of the top-emitting type is completed.

* * * * *